(12) United States Patent
Jiang et al.

(10) Patent No.: US 6,465,314 B1
(45) Date of Patent: *Oct. 15, 2002

(54) SEMICONDUCTOR PROCESSING METHODS

(75) Inventors: Tongbi Jiang, Boise, ID (US); David Y. Kao, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 126 days.

This patent is subject to a terminal disclaimer.

(21) Appl. No.: 09/680,242

(22) Filed: Oct. 5, 2000

Related U.S. Application Data

(63) Continuation of application No. 09/133,291, filed on Aug. 12, 1998, now Pat. No. 6,165,856.

(51) Int. Cl.[7] .............................................. H01L 21/336

(52) U.S. Cl. ....................................... 438/301; 438/305

(58) Field of Search ................................ 438/301, 303, 438/305, 514, 780

(56) References Cited

U.S. PATENT DOCUMENTS

| | | |
|---|---|---|
| 4,978,594 A | 12/1990 | Bruce et al. |
| 5,069,747 A | 12/1991 | Cathey et al. |
| 5,395,781 A | 3/1995 | Wilhoit |
| 5,489,540 A | 2/1996 | Liu et al. |
| 5,776,811 A | 7/1998 | Wang et al. |
| 6,165,856 A * | 12/2000 | Jiang et al. .................. 438/301 |
| 6,248,629 B1 * | 6/2001 | Liu et al. ..................... 438/258 |

OTHER PUBLICATIONS

Silicon Processing for the VLSI Era—vol. 1—Process Technology; S. Wolf and R.N. Tauber; pp. 321–327, 428–429, 1986.

Silicon Processing for the VLSI Era—vol. 2—Process Integration; S. Wolf; pp. 154–160, 1990.

(List continued on next page.)

*Primary Examiner*—Richard Booth
(74) *Attorney, Agent, or Firm*—Wells St. John P.S.

(57) ABSTRACT

The invention pertains to semiconductor processing methods of implanting dopants into semiconductor substrates. In one aspect, the invention includes, a semiconductor processing method comprising: a) forming an organic layer over a semiconductive substrate; and b) implanting a conductivity-enhancing dopant through the organic layer and into the semiconductive substrate. In another aspect, the invention includes a semiconductor processing method comprising: a) providing a semiconductive substrate and defining source and drain locations within the semiconductive substrate; b) forming an organic layer over the source and drain locations; c) implanting a conductivity-enhancing dopant through the organic layer and into the source and drain locations to form source and drain implant regions within the source and drain locations, respectively; and d) forming a transistor gate proximate the source and drain implant regions. In another aspect, the invention includes a semiconductor processing method comprising: a) forming a transistor gate over a semiconductive substrate and defining source/drain locations within the semiconductive substrate proximate the transistor gate; b) forming a polyimide layer over the transistor gate and over the source/drain locations; c) depositing photoresist over the polyimide layer; d) patterning the photoresist to form openings over the source/drain locations; and e) implanting a conductivity-enhancing dopant into the openings, through the polyimide layer and into the source/drain locations.

12 Claims, 3 Drawing Sheets

OTHER PUBLICATIONS

Silicon Processing for the VLSI Era—vol. 3—The Submicron MOSFET; S. Wolf; pp. 307–308, 1993.

Joint University and Industry Investigation of Polymide for Thin Film Organic Dielectrics for VLSI Interlevel Applications; K.H. Hesler, L.F. Fuller, C. Yue, D. Taylor and S. Popli1989 IEEE Eighth Biennial University/Government Industry Symposium; pp. 95–101.

Evaluation of 0.18 micron Ultra–Shallow Doping Technologies: a SEMATECH/uNIVERSITY/iNDUSTRY Cooperative Research Effort; Eleventh Biennial University/Government/Industry Microelectronics Symposium; Emi Ishida and Larry Larson; pp. 105–107.

Integration of Vapor Deposited Polyimide into a Multichip Module Packaging Process; Vladimir Liberman, Vincent Malba, and Anthony F. Bernhardt; IEEE Transactions on Components, Paging and manufacturing technology, Part B; Feb. 1997; pp. 13–16.

Analytical Circuit Model Approach to Charging Damage in Plasma/Implantation Processing; William G. En, Ben P. Shieh, and Nathan W. Cheung; 1996 $1^{st}$ International Symposium on Plasma Process–Induced Damage; May 13–14, 1996.

* cited by examiner

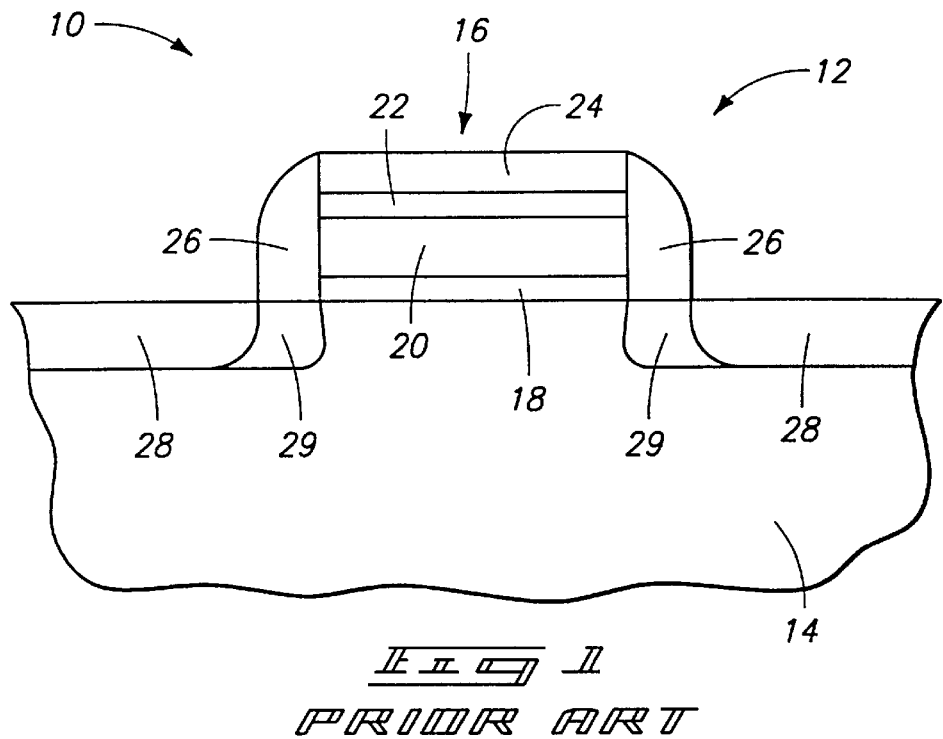
_Fig 1_
_PRIOR ART_
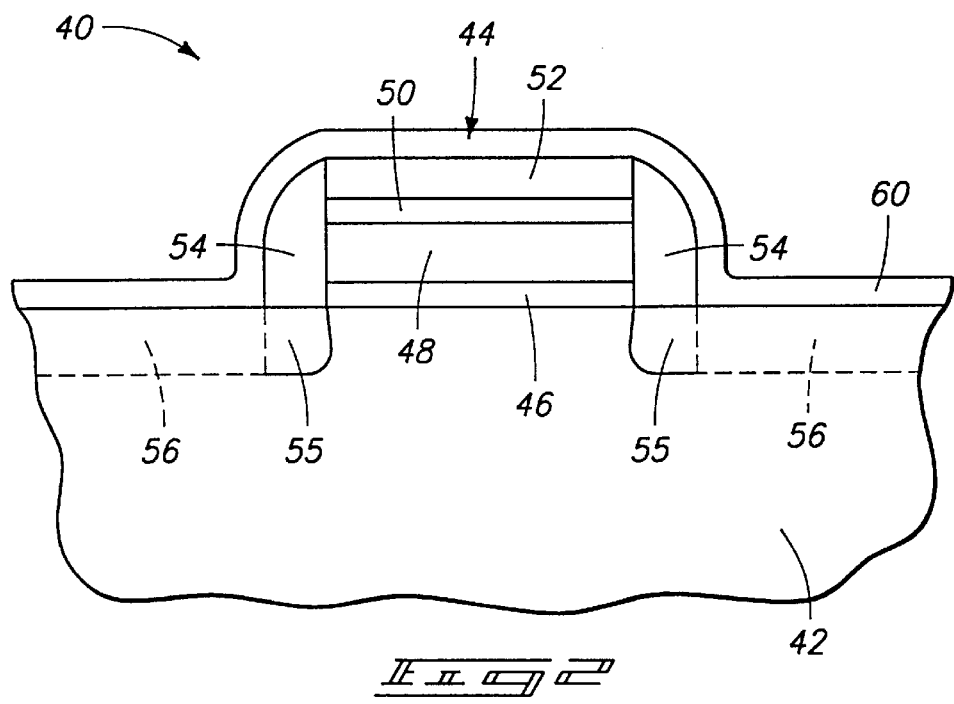
_Fig 2_

SEMICONDUCTOR PROCESSING METHODS

RELATED PATENT DATA

This is a continuation application of U.S. patent application Ser. No. 09/133,291 which was filed on Aug. 12, 1998, now U.S. Pat. No. 6,165,856.

TECHNICAL FIELD

The invention pertains to semiconductor processing methods of implanting dopants into semiconductor substrates. The invention has particular application to methods of forming shallow implant regions.

BACKGROUND OF THE INVENTION

A prior art semiconductive device 12 is shown as part of a semiconductor wafer fragment 10 in FIG. 1. Device 12 is a field effect transistor formed proximate a semiconductive substrate 14. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Field effect transistor 12 comprises a gate stack 16 comprising a gate oxide layer 18, a polysilicon layer 20, a silicide layer 22 and an insulative capping layer 24. Insulative capping layer 24 can comprise, for example, silicon nitride or silicon oxide. Silicide layer 22 can comprise, for example, tungsten silicide. Polysilicon layer 20 typically comprises conductively doped polysilicon, and gate oxide layer 18 comprises an insulative material, such as silicon oxide.

Spacers 26 are formed adjacent gate stack 16. Spacers 26 typically comprise an insulative material, such as silicon nitride or silicon dioxide.

Source/drain regions 28 are formed within substrate 14, and laterally offset from gate stack 16 by about a thickness of spacers 26. The formation of source/drain regions 28 typically comprises implanting a conductivity-enhancing dopant into substrate 14. Such implanting occurs after formation of spacers 26 to accomplish the shown lateral displacement of source/drain regions 28 from gate stack 16.

The dopant type within source/drain regions 28 and substrate 14 will vary depending on whether field effect transistor 12 is an n-type metal-oxide semiconductor (NMOS) or a p-type metal-oxide semiconductor (PMOS) transistor. For an NMOS transistor, source/drain regions 28 will predominately comprise n-type conductivity enhancing dopant, and substrate 14 will have a light background p-type dopant concentration. In contrast, if field effect transistor 12 is a PMOS transistor, source/drain regions 28 will predominately comprise p-type conductivity-enhancing dopant, and substrate 14 will have a light background n-type dopant concentration.

Lightly doped diffusion regions (LDD regions) 29 are formed beneath spacers 26 and constitute a part of the diffusion region. LDD regions 29 comprising a same dopant type as source/drain regions 28. LDD regions 29 are typically formed by implanting a dopant into substrate 14 after forming gate stack 16 and before forming spacers 26. Halo regions (not shown) can also be formed as part of the diffusion region. The halo regions will comprise an opposite type dopant as source/drain regions 28, and will typically be formed at junctions between regions 28 and 29, and substrate 14.

A continuing goal in semiconductor device fabrication is to minimize the device size. As field effect transistors become increasingly smaller, they become increasingly susceptible to short-channel effects. One way of reducing short-channel effects is to reduce a vertical depth of source/drain regions 28. In other words, to form shallow source/drain regions (i.e., source/drain regions that have a lowermost junction boundary that is less than 0.2 microns deep).

Forming shallow implants can be difficult. Generally, shallow implants cannot be formed simply by lowering implant energy, because such lower implant energy results in decreased focus of the implant, and corresponding loss of implant control. Accordingly, complex methods have been developed for forming shallow implants. In one method, a dopant is implanted into a first layer, such as a silicide, and then out-diffused from the first layer into a substrate to form a shallow implant. In another method a conductivity-enhancing dopant is implanted through an inorganic layer, such as silicon dioxide, and into an underlying substrate to form a shallow implant within the substrate. The inorganic layer must generally be removed from over the substrate after the implanting to enable further processing. Removal of the inorganic layers from semiconductive substrates is difficult.

For the above-discussed reasons, it is desirable to develop alternative methods for forming shallow implant regions in semiconductive substrates.

SUMMARY OF THE INVENTION

In one aspect, the invention encompasses a semiconductor processing method in which an organic layer is formed over a semiconductive substrate, and a conductivity-enhancing dopant is implanted through the organic layer and into the semiconductive substrate.

In another aspect of the invention, a semiconductive substrate is provided and source and drain locations are defined within the semiconductive substrate. An organic layer is formed over the source and drain locations. A conductivity-enhancing dopant is implanted through the organic layer and into the source and drain locations to form source and drain implant regions within the source and drain locations. A transistor gate is formed proximate the source and drain implant regions.

In yet another aspect of the invention, a transistor gate is formed over a semiconductive substrate and source/drain locations are defined within the semiconductive substrate proximate the transistor gate. A polyimide layer is formed over the transistor gate and over the source/drain locations. Photoresist is deposited over the polyimide layer. The photoresist is patterned to form openings over the source/drain locations. A conductivity-enhancing dopant is implanted into the openings, through the polyimide layer and into the source/drain locations.

BRIEF DESCRIPTION OF THE DRAWINGS

Preferred embodiments of the invention are described below with reference to the following accompanying drawings.

FIG. 1 is a diagrammatic, cross-sectional view of a semiconductive wafer fragment comprising a prior art field effect transistor.

FIG. 2 is a diagrammatic, cross-sectional view of a semiconductor wafer fragment being processed according to a method of the present invention.

DETAILED DESCRIPTION OF THE PREFERRED EMBODIMENTS

Figure 3:
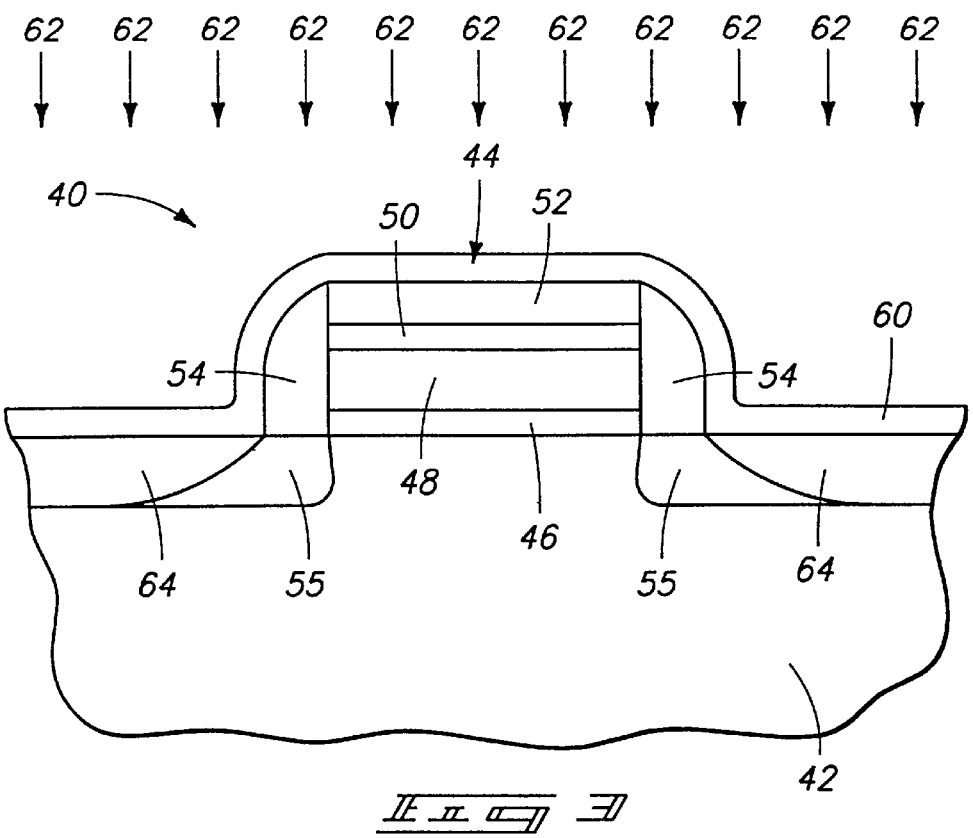
FIG. 3 is a diagrammatic, cross-sectional view of the wafer fragment of FIG. 2 at a processing step subsequent to that of FIG. 2.

This disclosure of the invention is submitted in furtherance of the constitutional purposes of the U.S. Patent Laws "to promote the progress of science and useful arts" (Article 1, Section 8).

A semiconductive wafer fragment 40 is illustrated in FIG. 2 at a processing step in accordance with the present invention. Wafer fragment 40 comprises a semiconductive substrate 42 and a gate stack 44 formed over substrate 42. Gate stack 44 comprises a gate oxide layer 46, polysilicon layer 48, silicide layer 50, and insulative capping layer 52. The materials of gate stack 44 are substantially equivalent to those of prior art gate stack 16 (discussed above with respect to FIG. 1).

Spacers 54 are formed laterally adjacent gate stack 44, and preferably comprise insulative materials, such as silicon oxide or silicon nitride.

LDD regions 55 extend beneath spacers 54.

Source and drain implant locations 56 are defined within substrate 42 proximate gate stack 44 and proximate LDD regions 55. Source/drain implant locations 56 are displaced from gate stack 44 by about a width of spacers 54.

An organic implant displacement layer 60 is formed over semiconductive substrate 42, and specifically over source/drain implant locations 56, as well as over gate stack 44. Organic layer 60 preferably comprises polyimide having a thickness of from about 300 angstroms to about 2000 angstroms. Polyimide layer 60 can be formed by any known methods, including, for example, vapor deposition polymerization technique. In the example method, a polyimide precursor is applied over substrate 42 and subsequently cured to form organic layer 60. Methods of depositing polyimide precursors and curing them to form polyimide are known to persons of ordinary skill in the art. For instance, the polyimide precursor polyamic acid can be formed over substrate 42. The polyamic acid can be converted to polyimide by heating the acid to a temperature greater than or equal to 300° C. for a time greater than or equal to about 10 minutes, at ambient pressure.

Organic layer 60 raises a depth of a subsequent implant into source/drain locations 56. For instance, if organic layer 60 comprises a 1000 angstrom thick polyimide layer, an implant of conductivity-enhancing dopant into source/drain locations 56 which would be at a depth of 0.25 microns without layer 60, will be raised to a depth of about 0.15 microns. Thus, organic layer 60 can be utilized with conditions which would otherwise not form shallow implant regions to form shallow implant regions. As discussed above in the Background section, a difficulty in forming shallow implant regions is that if low energy implants are utilized it is difficult to focus the implants. Organic layer 60 enables use of high energy implants to form shallow implant regions, thus overcoming a difficulty of the prior art.

Referring to FIG. 3, a conductivity enhancing dopant 62 is implanted through organic layer 60 and into source/drain locations 56 (shown in FIG. 2). Such implant forms source/drain regions 64. Implanted dopant 62 can comprise either an n-type conductivity-enhancing dopant, or a p-type conductivity-enhancing dopant, depending on whether it is desired to form an NMOS device or a PMOS device. An example n-type conductivity-enhancing dopant is arsenic. Arsenic can be implanted at a dose of about $5 \times 10^{15}$ atoms/$cm^2$, an energy of from about 30 keV to about 40 keV, and a temperature of about 200° C. at atmospheric pressure through a 1000 angstrom thick polyimide layer 60 to form source/drain regions 64 extending to lowermost junction depth depths of less than or equal to about 0.15 microns.

An example p-type dopant is $BF_2$. Such dopant can be implanted at a dose of about $5 \times 10^{15}$ atoms/$cm^2$ and an energy of 25 keV through a 1000 angstrom thick polyimide layer to form source/drain regions 64 which are less than or equal to about 0.15 microns deep within substrate 42.

Figure 4:
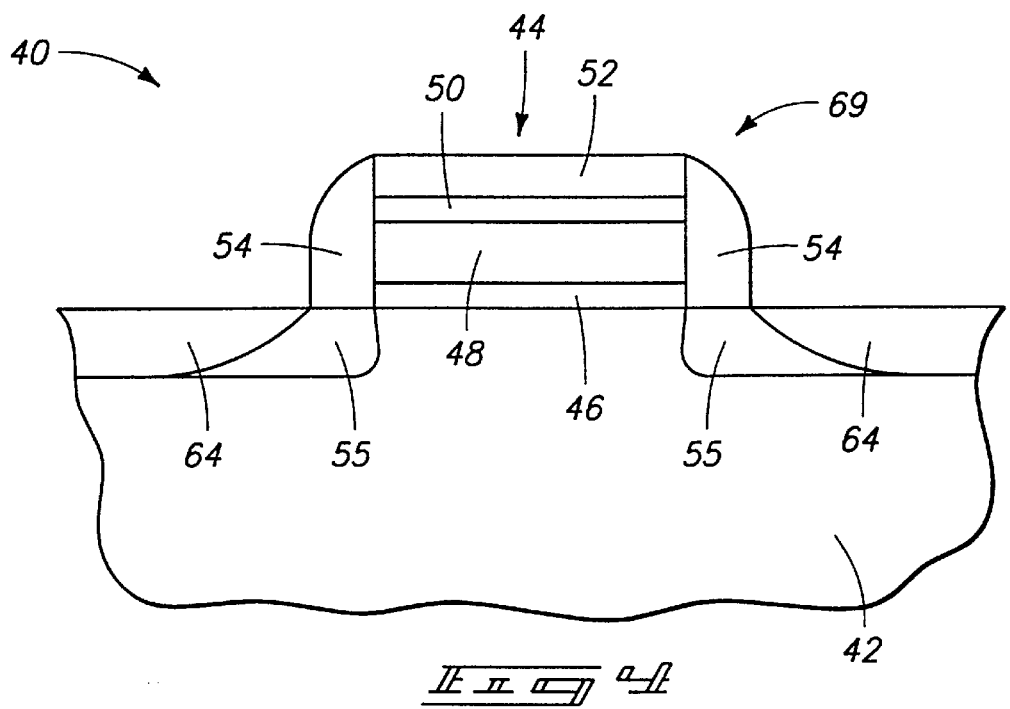
FIG. 4 is a diagrammatic, cross-sectional view of the wafer fragment of FIG. 2 at a first embodiment processing step subsequent to that of FIG. 3.
Figure 5:
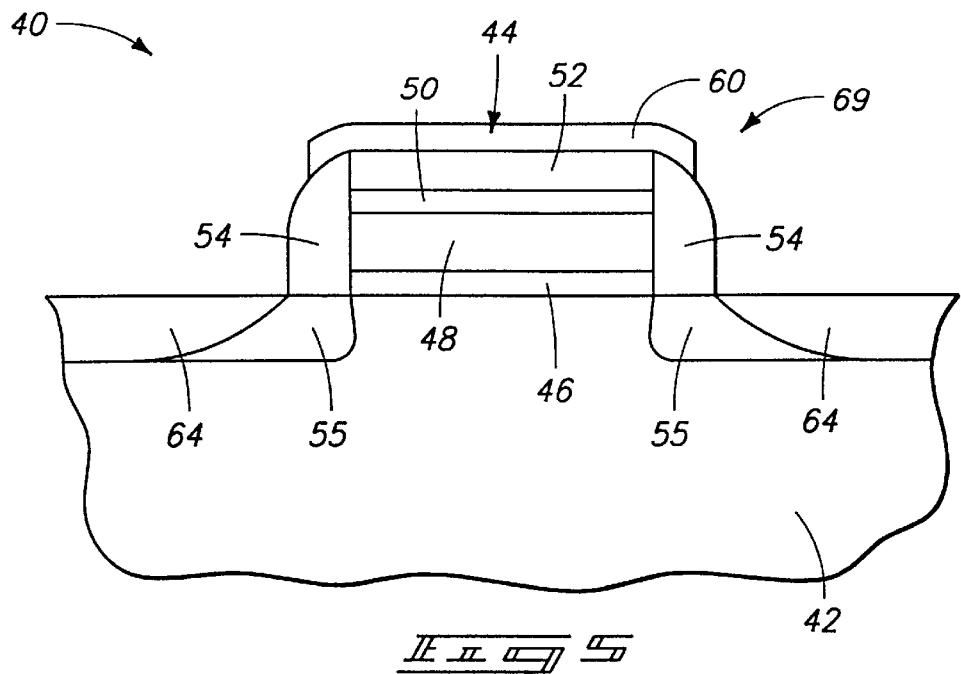
FIG. 5 is a diagrammatic, cross-sectional view of the semiconductive wafer fragment of FIG. 2 at a second embodiment processing step subsequent to that of FIG. 3.

Referring to FIGS. 4 and 5, two embodiments for subsequent processing of semiconductive wafer 40 are illustrated. In both embodiments, organic layer 60 (shown in FIG. 3) is stripped from over implanted regions 64. An example method for stripping organic layer 60, when organic layer 60 comprises polyimide, is a wet etch utilizing chemicals possessing high polarity and high boiling temperatures, such as N-methyl-2-pyrrolidone and gamma-butyrolactone. Wet etching can also be done utilizing alkali solutions, ethylenediamine and hydrazine. Alternatively, the polyimide can be removed with a reactive ion etch, such as $O_2$ plasma. Other reactive ion etches utilizing fluorine-containing gasses, such as $CF_4$, $SF_6$, and $NF_3$ can also be used to remove a polyimide layer.

A distinction between the embodiments of FIGS. 4 and 5 is that in FIG. 4 organic layer 60 is stripped from over all of semiconductive substrate 42, whereas in FIG. 5 organic layer 60 is selectively stripped from over implanted regions 64 and left over other portions of semiconductive substrate 42. A method of accomplishing the FIG. 5 selective stripping of organic layer 60 is to pattern layer 60 with, for example, photoresist, prior to stripping layer 60.

In either of the embodiments of FIGS. 4 and 5, source/drain regions 64 and gate stack 44 together form a field effect transistor 69. After organic layer 60 is stripped from over source/drain regions 64, electrically conductive contacts can be formed to source/drain regions 64 to incorporate field effect transistor 69 into an integrated circuit.

Figure 6:
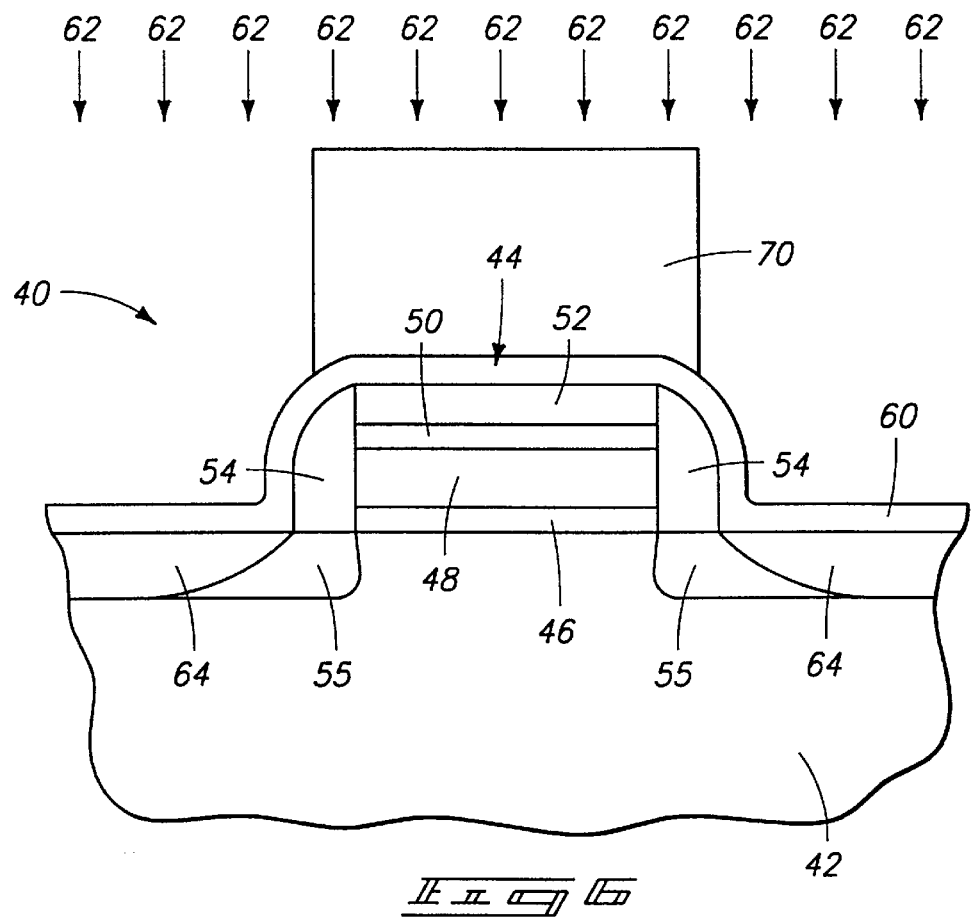
FIG. 6 is a diagrammatic, cross-sectional view of the semiconductive wafer fragment of FIG. 2 at a third embodiment processing step subsequent to that of FIG. 2.

An alternative method for processing wafer fragment 40 of FIG. 2 is described with reference to FIG. 6. In describing the embodiment of FIG. 6, similar numbering to that utilized in describing the embodiments of FIGS. 3–5 will be used, with differences indicated by different numerals. A distinction between the embodiment of FIG. 6 and the embodiments of FIGS. 3–5 is that a patterned photoresist layer 70 is provided over substrate 42 prior to implanting of a dopant 62 to form source/drain regions 64. Patterned photoresist layer 70 can be formed by providing a photoresist layer over substantially an entirety of wafer 42 and subsequently patterning the layer to expose organic layer 60 over source/drain locations 56 (shown in FIG. 2). Patterned photoresist layer 70 covers regions of substrate 42 which are not to be implanted with dopant 62.

Dopant 62 is implanted through openings in patterned photoresist layer 70 to form source/drain regions 64. After the implant of dopant 62, photoresist layer 70 can be stripped from over substrate 42. Also, organic layer 60 can be stripped in accordance with the methods discussed above with reference to FIGS. 4 and 5.

It is to be understood that the invention encompasses other embodiments beyond the exemplary embodiments shown, and is to be limited only in accordance with the claims that follow. For instance, although gate stack 44 is shown formed prior to formation of source/drain regions 64, it is to be understood that the invention encompasses embodiments in which source/drain regions 64 are formed, before gate stack 44. Such embodiments can be accomplished by providing a masking layer over substrate 42 in about the position of gate stack 44 prior to provision of source/drain regions 64. Such masking layer can extend either across an entire area covered by gate stack 44 and spacers 54, or across only the area of gate stack 44.

Also, although the invention is shown in accordance with embodiments for forming source/drain regions 64 which are displaced. from gate stack 44 by about a distance of spacers 54, it is to be understood that the invention can also be utilized for forming source/drain regions 64 which extend to gate stack 44. Such source/drain regions include LDD regions and halo regions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:

forming an organic layer over a semiconductive substrate;

implanting a conductivity-enhancing dopant through the organic layer and into a portion of the semiconductive substrate; and after the implanting, stripping the organic layer from over the portion of the semiconductive substrate and leaving the organic layer over other at least one other portion of the semiconductive substrate.

2. The method of claim 1 wherein the organic layer is polyimide.

3. A semiconductor processing method comprising:

forming a transistor gate over a semiconductive substrate;

forming an organic layer over the transistor gate and over the semiconductor substrate;

implanting a conductivity-enhancing dopant through the organic layer and into the semiconductive substrate to form conductive regions proximate the transistor gate; and after the implanting, removing the organic layer from over the conductive regions while leaving the organic layer over the transistor gate.

4. The method of claim 3 wherein the organic layer comprises polyimide.

5. The method of claim 3 wherein the conductivity-enhancing dopant is an n-type dopant.

6. The method of claim 3 wherein the conductivity-enhancing dopant is an p-type dopant.

7. The method of claim 3 wherein the organic layer comprises polyimide and comprises a thickness of from about 300 angstroms to about 2000 angstroms.

8. A semiconductor processing method comprising:

forming a polysilicon-containing transistor gate over a semiconductive substrate and defining source/drain locations within the semiconductive substrate proximate the transistor gate;

forming a polyimide layer over the transistor gate and over the source/drain locations;

depositing photoresist over the polyimide layer;

patterning the photoresist to form openings over the source/drain locations; and implanting a conductivity-enhancing dopant into the openings, through the polyimide layer and into the source/drain locations.

9. The method of claim 8 further comprising:

before forming the polyimide layer, forming spacers adjacent the transistor gate.

10. The method of claim 8 wherein the forming the polyimide layer comprises:

forming a polyimide precursor layer over the transistor gate and over the source/drain regions; and converting the precursor layer to a polyimide layer.

11. The method of claim 8 further comprising:

after the implanting, stripping the polyimide layer from over the source/drain locations.

12. The method of claim 8 further comprising:

after the implanting, stripping the polyimide layer from over the transistor gate and from over the source/drain locations.

* * * * *

UNITED STATES PATENT AND TRADEMARK OFFICE
CERTIFICATE OF CORRECTION

PATENT NO.   : 6,465,314 B1
DATED        : October 15, 2002
INVENTOR(S)  : Jiang et al.

It is certified that error appears in the above-identified patent and that said Letters Patent is hereby corrected as shown below:

<u>Column 5,</u>
Line 49, please remove the word "other" after "over".

Signed and Sealed this

First Day of July, 2003

JAMES E. ROGAN
*Director of the United States Patent and Trademark Office*